(12) United States Patent
Sawada et al.

(10) Patent No.: US 6,184,516 B1
(45) Date of Patent: Feb. 6, 2001

(54) PHOTOELECTRIC CONVERSION DEVICE AND IMAGE SENSOR

(75) Inventors: Koji Sawada, Atsugi; Hiraku Kozuka, Hiratsuka, both of (JP)

(73) Assignee: Canon Kabushiki Kaisha, Tokyo (JP)

(*) Notice: Under 35 U.S.C. 154(b), the term of this patent shall be extended for 0 days.

(21) Appl. No.: 09/086,331

(22) Filed: May 28, 1998

(30) Foreign Application Priority Data

May 30, 1997 (JP) .................................................. 9-142192

(51) Int. Cl.$^7$ .................................................. H01J 40/14
(52) U.S. Cl. .................................................. 250/214.1; 250/208.1; 250/214 A
(58) Field of Search .................. 250/214 A, 208.1, 250/214.1, 214 LA, 214 R, 208.2; 327/427, 431, 434, 435, 436, 437, 514, 515; 257/222, 223, 225, 226, 227, 229, 230, 233, 234, 431, 443

(56) References Cited

U.S. PATENT DOCUMENTS 5,233,180 * 8/1993 Tsuruta et al. ..................... 250/208.1
5,488,415 * 1/1996 Uno ..................................... 348/241
5,717,458 * 2/1998 Yonemoto ........................... 348/305

* cited by examiner

Primary Examiner—John R. Lee
(74) Attorney, Agent, or Firm—Morgan & Finnegan, L.L.P.

(57) ABSTRACT

A photoelectric conversion device and an image sensor having a plurality of photodetectors and peripheral circuits, configured with MOS transistors, which are integrally formed on a semiconductor substrate. In the peripheral circuits, including a MOS operational amplifier, for outputting electric signals obtained from the photodetectors to outside, a source follower using an n-channel MOS transistor and a source follower using a p-channel MOS transistor are formed subsequent to the MOS operational amplifier. Output from the MOS operational amplifier enters the gate of the source follower of the n-channel MOS transistor, output from the source follower of the n-channel MOS transistor enters the gate of the source follower using a p-channel MOS transistor, and output from the source follower of the p-channel MOS transistor enters a negative input terminal of the MOS operational amplifier as well as is outputted to outside to drive an external load.

14 Claims, 10 Drawing Sheets

US 6,184,516 B1

PHOTOELECTRIC CONVERSION DEVICE AND IMAGE SENSOR

BACKGROUND OF THE INVENTION

The present invention relates to a photoelectric conversion device and an image sensor and, more particularly, to reduction of fixed pattern noise (FPN) in a photoelectric conversion device having a plurality of photodetectors and peripheral circuits, configured with MOS transistors, integrally formed on a semiconductor substrate, and to an image sensor.

Recently, a one- or two-dimensional photoelectric conversion device, having a plurality of photodetectors and peripheral circuits for processing and controlling signals, integrally formed on a semiconductor substrate, has been developed. For example, a photoelectric conversion device having an internal reference voltage generator configured with an operational amplifier is proposed in Japanese Patent Application Laid-Open No. 9-65215.

An example of a circuit configuration of a photoelectric conversion device having a plurality of photodetectors and peripheral circuits integrally formed on a semiconductor substrate is shown in FIG. 7. In FIG. 7, peripheral circuits include a CMOS operational amplifier 40, and reference numeral 20 denotes a plurality of photodetectors; 22, a connecting pad; 30, a charge-voltage converters; 34, a switch; 35, a common output line; and 36, a shift register. The photodetectors 20 are connected to the charge-voltage converters 30 where charges generated depending upon incident light on the photodetectors 20 are converted to voltage signals. The voltage signals are sequentially outputted onto the common output line 35 in accordance with signals provided from the shift register 36 to the charge-voltage converters 30. The common output line 35 is connected to a positive terminal of the CMOS operational amplifier 40, and, after the input voltage signals on the common output line 35 are processed with impedance transformation by the CMOS operational amplifier 40, the voltage signals are outputted via the switch 34 and the pad 22.

The CMOS operational amplifier 40 includes a differential section 50 and an output section 51 as shown in FIG. 8 which is based on "Analog MOS Integrated Circuits for Signal Processing", R. Gregorian, G. C. Temes, pp. 170, FIG. 4.59. Generally, larger current flows in the output section 51 than other block in order to drive an external load. As for the circuit configuration of the output section 51, a source follower using an n-channel MOS (nMOS) transistor, whose mutual conductance $g_m$ is larger than that of a p-channel MOS (pMOS) transistor, an inversion amplifier and a push-pull circuit which are formed by combining nMOS and pMOS transistors are used.

In a MOS transistor, when a voltage is applied across a drain and a source while a channel is formed by applying a voltage to a gate, electric field becomes strong in the vicinity of the drain-side edge of the channel, which sometimes generates new electron-hole pairs due to impact ionization. Most of the carrier generated due to the impact ionization becomes substrate current and absorbed by a reference potential of the semiconductor substrate, however, a part of the carrier recombines. The recombination is accompanied by light emission, and the emitted light further generates new electron-hole pairs in the semiconductor substrate. The carrier generated in this manner becomes stray carrier which diffuses over the semiconductor substrate. When the stray carrier enters the photodetectors, ghost signals are generated in addition to essential signals generated in proportion to incident light. These ghost signals are a primary factor of fixed pattern noise in a photoelectric conversion device.

The measurement result, by the applicants of the present invention, of substrate current and drain current with respect to gate voltage Vg of nMOS and pMOS transistors is shown in FIG. 9. In FIG. 9, an abscissa shows the absolute value of the gate voltage, and an ordinate shows substrate current and drain current. The substrate current flowing in the nMOS transistor is about $10^4$ to $10^5$ larger than that in the pMOS transistor, which indicates that more electron-hole pairs are generated due to impact ionization in the nMOS transistor the in the pMOS transistor. Thus, since the fact that more substrate current flows in the nMOS transistor than in the pMOS transistor, stray carrier is more easily generated in a semiconductor substrate of an nMOS transistor than a pMOS transistor.

Further, substrate current in a MOS transistor depends upon the drain-source voltage more than the gate voltage. Experimental results show that the substrate current increases logarithmically with respect to increase in the drain-source voltage. Accordingly, it is determined that generation of stray carrier can be reduced by lowering the drain-source voltage.

Fixed pattern noise, with respect to a signal level, caused by stray carrier entering a plurality of photodetectors is not ignorable as sensitivity of the photodetectors improves.

FIG. 10B is a graph showing generated fixed pattern noise in a conventional one-dimensional image sensor (FIG. 10A) including the operational amplifier 40 using an nMOS transistor in an output section for driving a load. As shown in FIG. 10A, the photodetectors 20 and peripheral circuits 21 including the operational amplifier 40 having an nMOS transistor are formed on a semiconductor substrate 100. With this configuration, as shown in FIG. 10B, dark current corresponding to the portion where the output section is laid out is larger than other portions, which shows that fixed pattern noise is caused by stray carrier entering the photodetectors 20.

SUMMARY OF THE INVENTION

The present invention has been made in consideration of the above situation, and has as its object to provide a photoelectric conversion device, having a plurality of photodetectors and peripheral circuits integrally formed on a single semiconductor substrate, capable of reducing generation of stray carrier in the peripheral circuits, thereby reducing fixed pattern noise due to the stray carrier entering the photodetectors.

According to the present invention, the foregoing object is attained by providing a photoelectric conversion device comprising: a plurality of photodetectors which output electric signals in accordance with quantity of incident light; an operational amplifier having a MOS transistor; and an output circuit, wherein the plurality of photodetectors, the operational amplifier, and the output circuit are integrally formed on a single semiconductor substrate, and the operational amplifier and the output circuit perform impedance transformation for the electric signals outputted from the photodetectors.

According to the present invention, the foregoing object is also attained by providing an image sensor having a plurality of photoelectric conversion devices formed on a single semiconductor substrate, wherein each photoelectric conversion apparatus comprises: a plurality of photodetectors which output electric signals in accordance with quantity of incident light; an operational amplifier having a MOS transistor; and an output circuit, wherein the plurality of photodetectors, the operational amplifier, and the output circuit are integrally formed on a single semiconductor substrate, and the operational amplifier and the output circuit perform impedance transformation for the electric signals outputted from the photodetectors.

Preferably, the output circuit includes: a first source follower using an n-channel MOS transistor; and a second source follower using a p-channel MOS transistor for driving an external load to which an output of the first source follower is inputted and whose output enters an negative input terminal of the operational amplifier.

With the aforesaid configurations, an output section, which is the main source of stray carrier, of the photoelectric conversion device for driving a large load is configured with pMOS transistors without using nMOS transistors.

Preferably, in the output circuit, a voltage drop means is provided between drain of the n-channel MOS transistor of the first source follower and power source.

With the aforesaid configuration, it is possible to reduce the drain-source voltage of the MOS transistor. Therefore, stray carrier is reduced, and fixed pattern noise caused by the stray carrier entering the photodetectors can be reduced.

Further, preferably, the second source follower is formed with two p-channel MOS transistors and the two p-channel nMOS transistors are connected in series between power source and ground, an input signal is applied to gate of the p-channel MOS transistor on the ground side and a signal is outputted from a connection point of the two p-channel MOS transistors, and an absolute value of a threshold voltage of the p-channel MOS transistor on the ground side is set lower than that of the p-channel MOS transistor on the power source side.

With the aforesaid configuration, it is possible to widen the dynamic range of the output circuit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described in detail in accordance with the accompanying drawings.

FIRST EMBODIMENT

Figure 1:
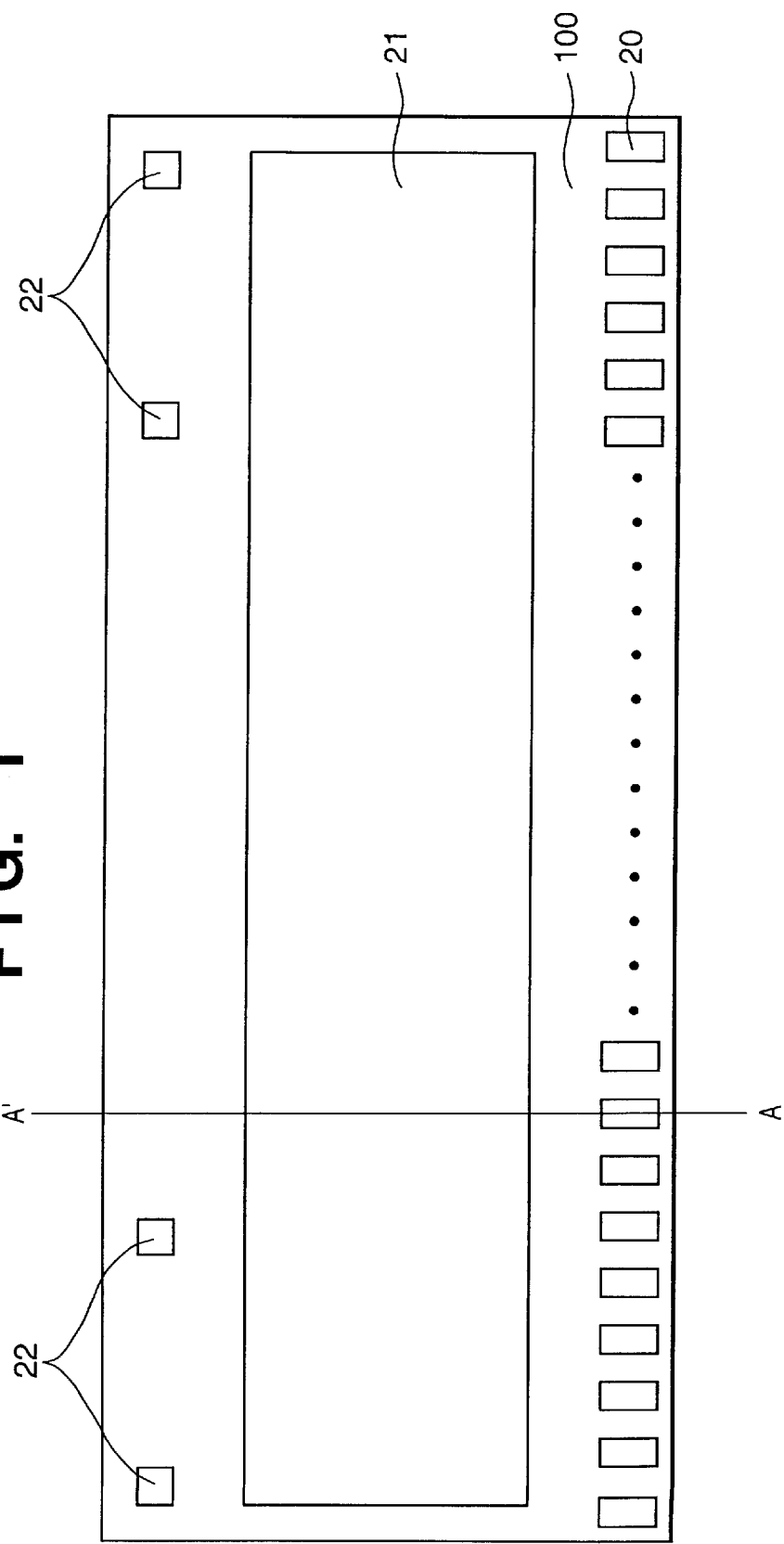
FIG. 1 shows a configuration of a photoelectric conversion device having a plurality of photodetectors and peripheral circuits integrally formed on a single semiconductor substrate according to a first embodiment of the present invention.
Figure 2:
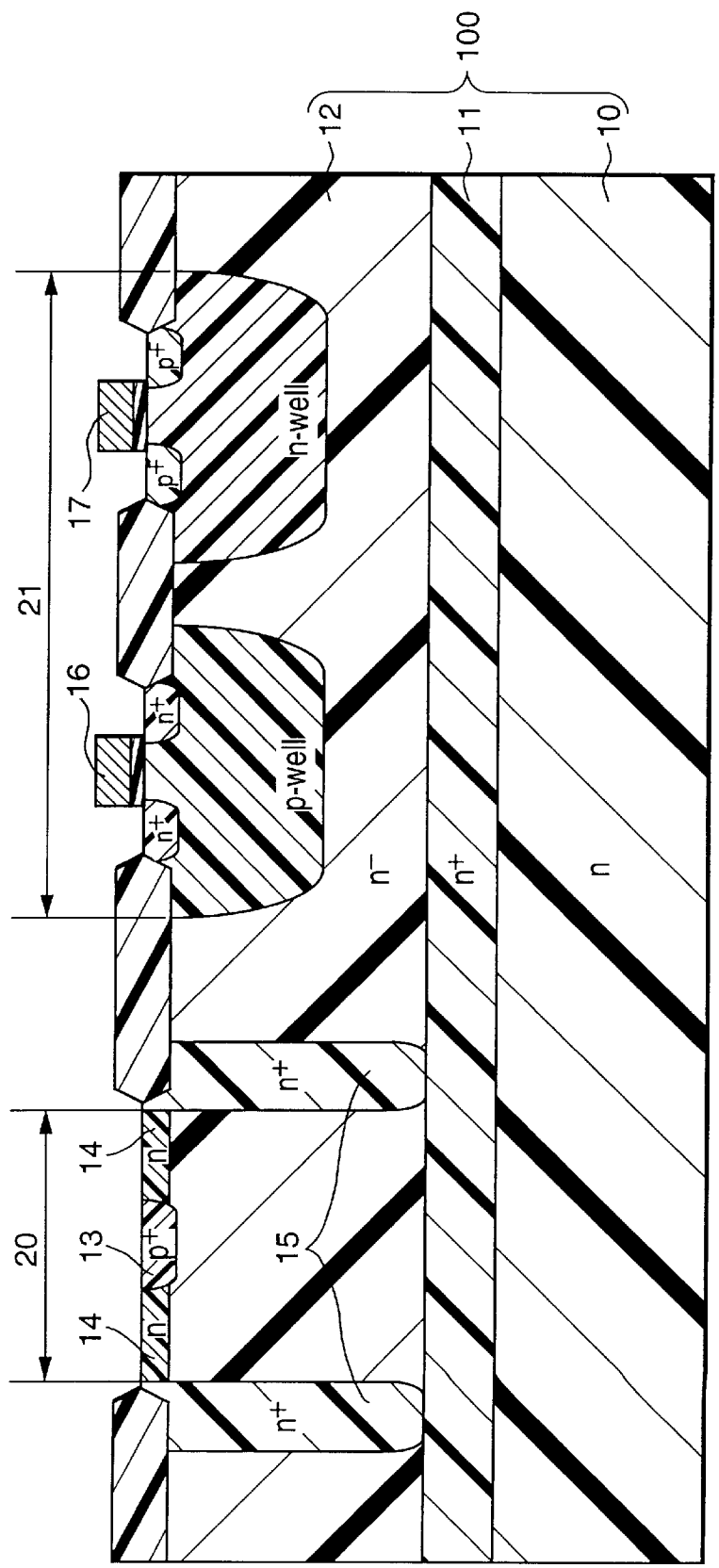
FIG. 2 is a cross-sectional view taken along a line A-A'in FIG. 1.

FIG. 1 shows a configuration of a photoelectric conversion device having a plurality of photodetectors and peripheral circuits integrally formed on a single semiconductor substrate according to the first embodiment of the present invention, and FIG. 2 is a cross-sectional view taken along a line A-A'in FIG. 1.

Note, stray carrier which causes fixed pattern noise is of the same conduction type as carrier of photo-signals, and it is a minor carrier in the semiconductor substrate. As for diffusion distance of the minor carrier, the diffusion distance of holes is shorter than that of electrons; therefore, it is effective to use an n-type semiconductor substrate to reduce fixed pattern noise caused by stray carrier entering the photodetectors since the stray carrier generated in peripheral circuits does not easily reach the photodetectors.

In the first embodiment, an $n^+$ type buried layer 11 and an $n^-$ type epitaxial layer 12 are formed on an n type semiconductor substrate 10. Further, on the surface of the $n^-$ type epitaxial layer 12, a plurality of photodetectors 20, peripheral circuits 21 including shift registers, an operational amplifier, and an output circuit, and connecting pads 22 are formed.

As shown in FIG. 2, the photodetectors 20 are formed in such a manner that plurality of $p^+$ type areas 13 and n type areas 14 are formed on the $n^-$ type epitaxial layer 12 on the surface of the n type semiconductor substrate 10, further, $n^+$ type barrier areas 15 are formed around the $p^+$ type areas 13 and the n type areas 14. Holes of the minor carrier, which is generated in the peripheral circuits 21 and causes fixed pattern noise, in the n type semiconductor substrate 10 are partially prevented from entering the photodetectors 20 by potential barrier of $n^+$ type buried layer 11 and the $n^+$ type barrier areas 15.

In the first embodiment, a large number of photodetectors, e.g., 234 photodetectors, are arranged in one dimension on the semiconductor substrate 100 as shown in FIG. 1, and forms a part of an image sensor.

Further, the peripheral circuits 21 is entirely configured with CMOS circuits. A source follower of an nMOS transistor 16, on a p-type well, whose gate is connected to an anode of the photodetector 20, which is a photodiode formed by a pn junction, is formed. Further, a charge-voltage converter is formed by connecting the source of the nMOS transistor 16 to the source of a pMOS transistor 17 on an n-type well for switching. The nMOS transistor 16 and the pMOS transistor 17 form an output unit including a shift register, an operational amplifier, and a switch.

Figure 3:
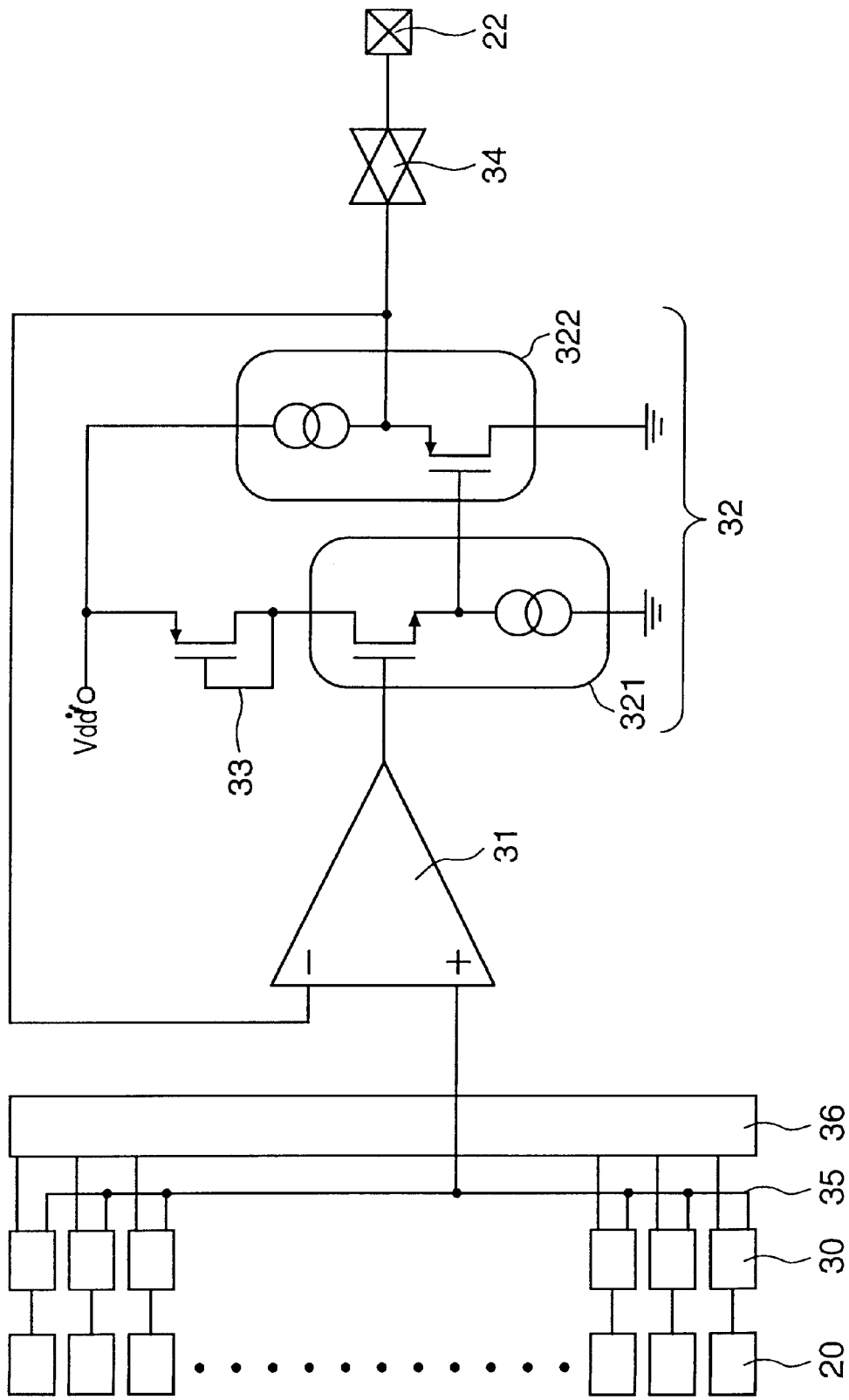
FIG. 3 shows a circuit configuration of the photoelectric conversion device according to the first embodiment of the present invention.

FIG. 3 is a view showing a circuit configuration of the photoelectric conversion device according to the first embodiment of the present invention. In FIG. 3, reference numeral 30 denotes charge-voltage converters; 31, an operational amplifier; 32, an output circuit; 34, a switch; 35, a common output line; and 36, a shift register.

The photodetectors 20 are connected to the charge voltage converters 30 where charges stored depending upon quantity of light incidented on the photodetectors 20 are converted to voltage signals. The voltage signals are sequentially outputted onto the common output line 35 in response to signals provided from the shift register 36 to the charge-voltage converters 30. The common output line 35 is connected to a positive terminal of the operational amplifier 31 and output of the output circuit 32 is connected to a negative terminal of the operational amplifier 31. After the voltage signals on the common output line 35 are processed by impedance conversion by the operational amplifier 31 and the output circuit 32, they are outputted outside via the switch 34 and the pad 22.

The output circuit 32 includes a source follower 321 configured with an nMOS transistor for level shifting and a constant current source, and a source follower 322 configured with a pMOS transistor for driving an external load and a constant current source. In order to suppress generation of stray carrier caused by impact ionization in the nMOS transistor of the source follower 321, a pMOS transistor 33 whose drain and gate are connected is provided as a voltage drop unit between the drain of the nMOS transistor of the source follower 321 and power source. The pMOS transistor 33 is used as the voltage drop unit in the first embodiment, however, the present invention is not limited to this, and a resistor or a diode may be used instead of the pMOS transistor.

Further, there is a case where an nMOS transistor is used in the operational amplifier 31, however, since the operational amplifier 31 has only to drive the nMOS transistor of the output circuit 32, current flowing through the operational amplifier 31 is a fraction ($10^{-n}$) of the current flowing through the output circuit 32. Therefore, stray carriers generated in the operational amplifier do not cause noise which is considered a problem with respect to a signal level. However, in order to further reduce fixed pattern noise, it is more effective to use a pMOS transistor as an input transistor of the differential section of the input unit of the operational amplifier. This configuration is a so-called pMOS top type circuit configuration.

Figure 4:
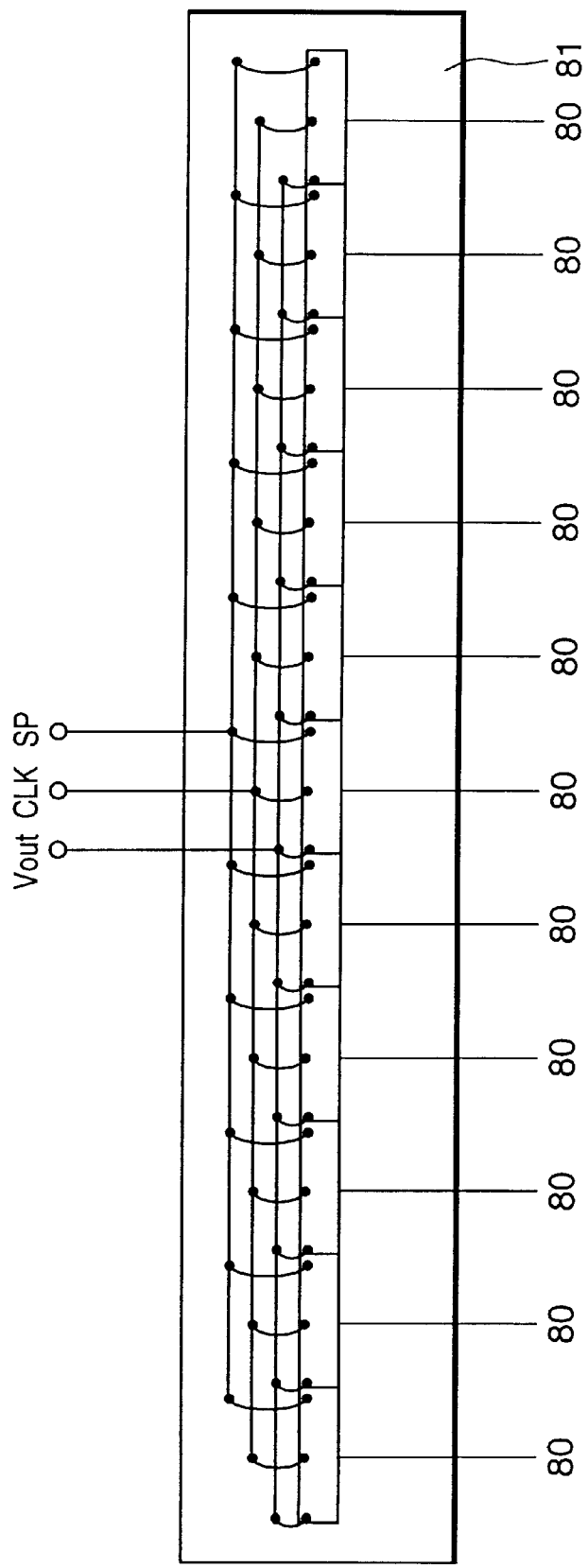
FIG. 4 shows a schematic diagram of an image sensor according to the first embodiment of the present invention.

FIG. 4 shows schematic diagram of an image sensor according to the first embodiment of the present invention.

As shown in FIG. 4, eleven photoelectric conversion semiconductor chips 80 each having the configuration of the photoelectric conversion device as shown in FIG. 1 are mounted on a glass epoxy substrate 81 as a photodetector array to form an image sensor conforming to the width of an A4-size document. On the glass epoxy substrate 81, common signal lines for a start pulse SP, a clock CL, and an output control signal $V_{out}$ are connected to input/output pads of each photoelectric semiconductor chip 80 by wire bonding.

First, when the start pulse SP is applied, charges corresponding to quantity of incident light are stored in the capacitors, provided in respective photodetector, simultaneously. Then, all the photodetectors are reset, and charging operation restarts. Thereafter, the capacitors are sequentially scanned from the first to the last in response to signals from the shift registers, integrally formed in the chips 80, and voltages corresponding to the charges stored in the capacitors are outputted to the common output line $V_{out}$.

Figure 7:
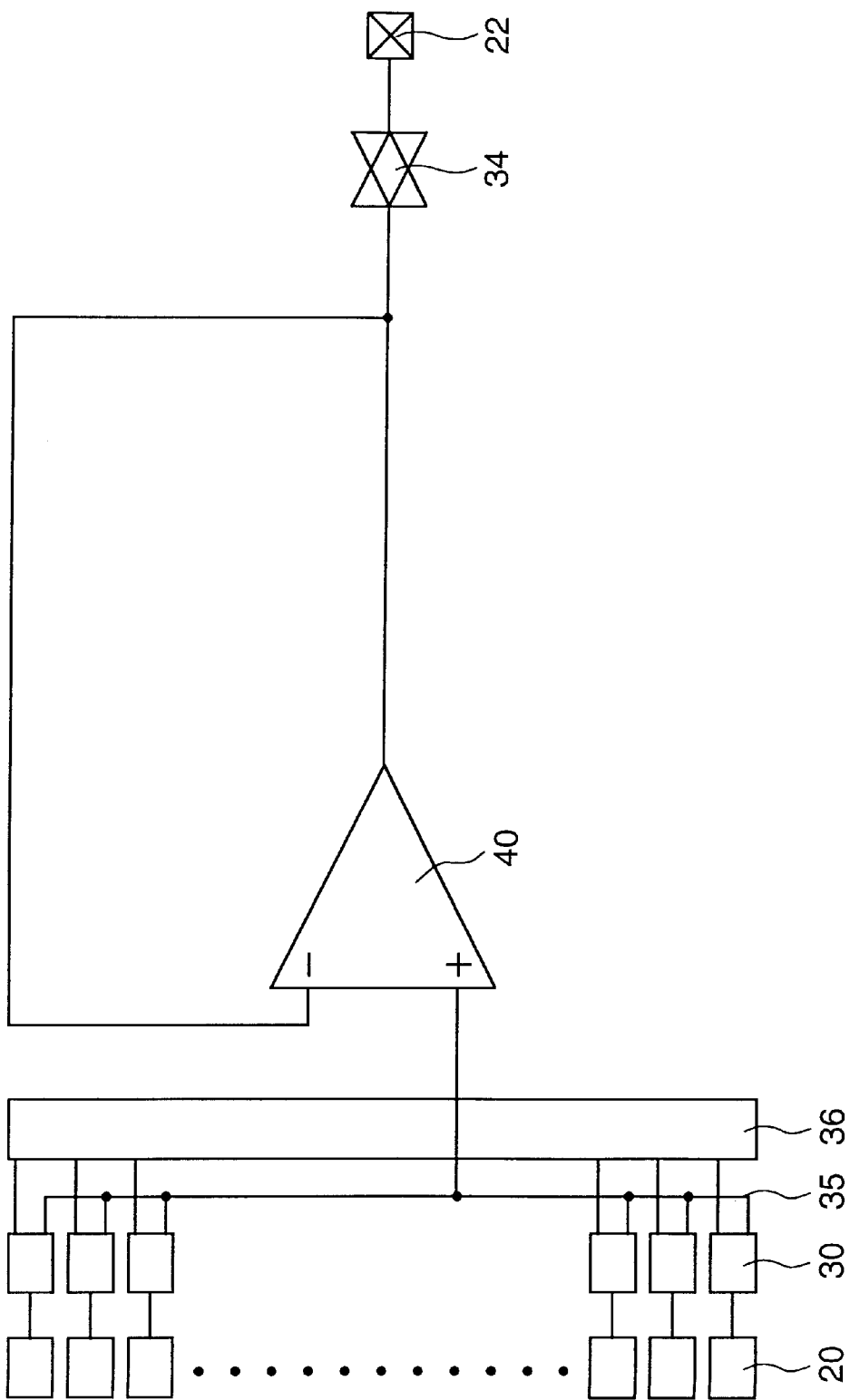
FIG. 7 show a circuit configuration of the conventional photoelectric conversion device.
Figure 8:
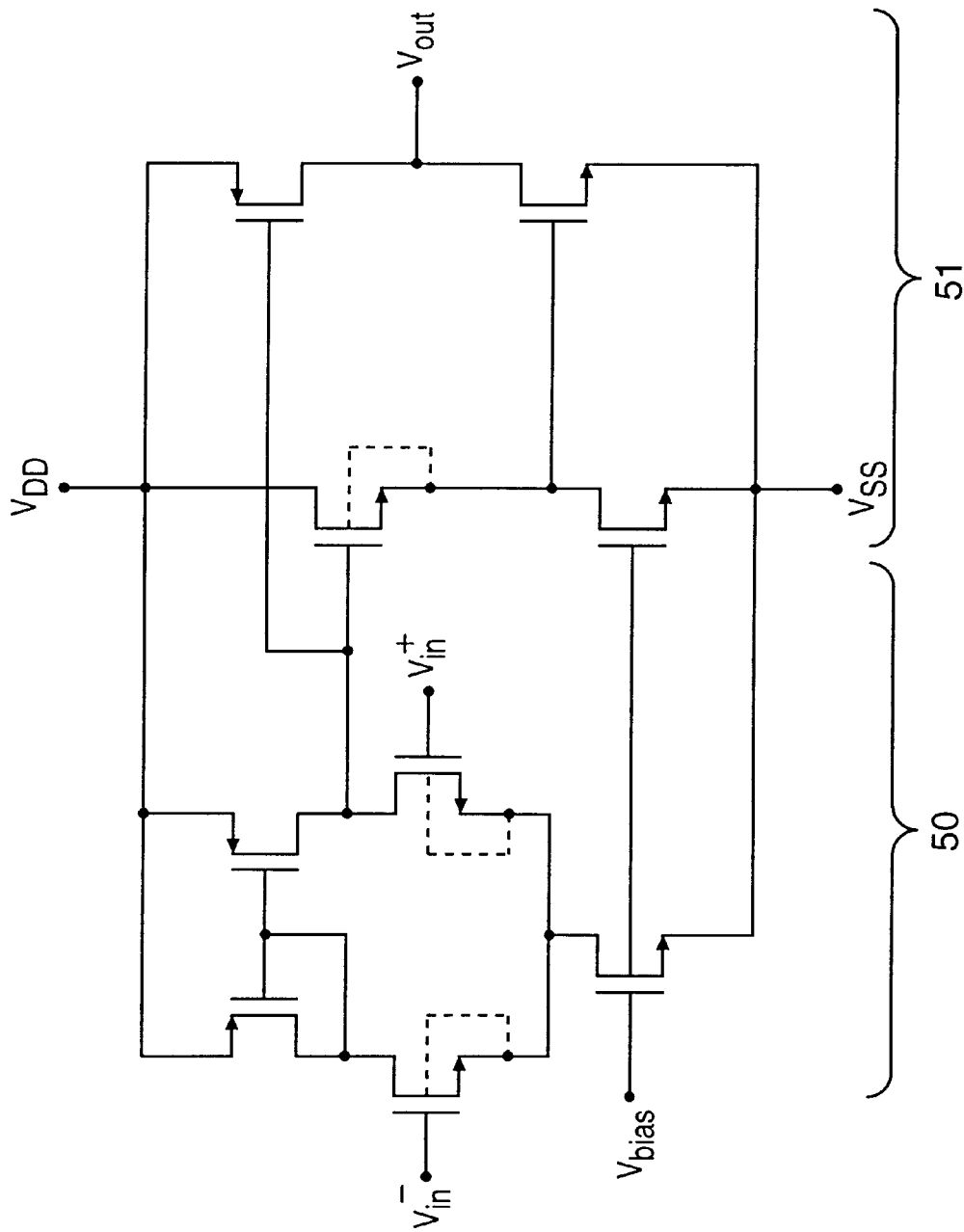
FIG. 8 is a circuit diagram of a CMOS operational amplifier used in the photoelectric conversion device shown in FIG. 7.
Figure 9:
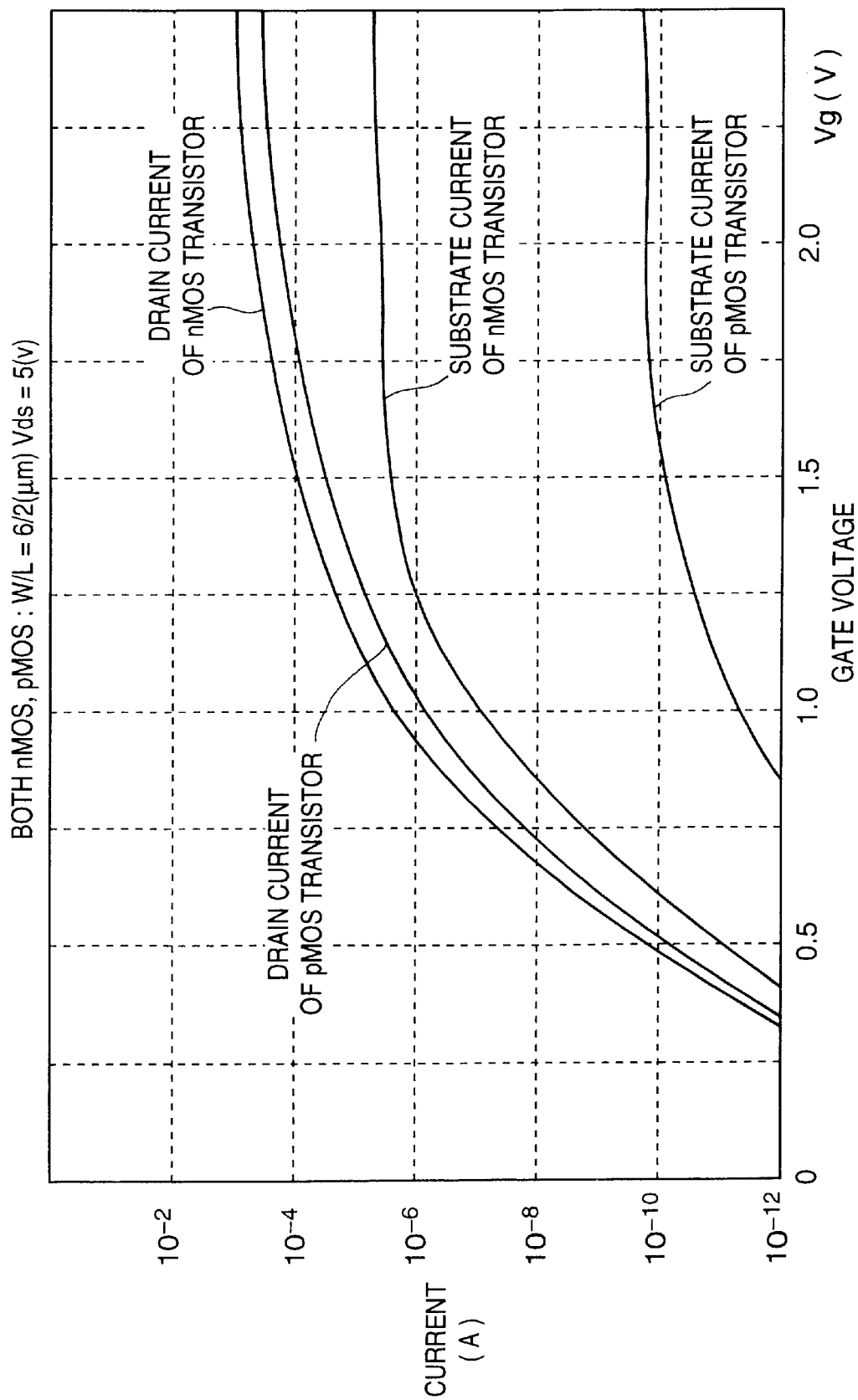
FIG. 9 is a graph showing substrate current and drain current with respect to gate voltage of MOS transistors.

As an experimental result of fixed pattern noise generated in the configuration shown in FIG. 3 according to the first embodiment, the level of the generated fixed pattern noise is approximately less than a tenth of the level of fixed pattern noise generated in the conventional output circuit shown in FIG. 7, for driving an external load.

Thus, according to the first embodiment of the present invention, it is possible to suppress the generation of stray carrier due to impact ionization by reducing operating current in an operational amplifier which tends to generate stray carrier; thereby suppressing fixed pattern noise caused by the stray carrier.

SECOND EMBODIMENT

Next, the second embodiment of the present invention will be explained with reference to accompanying drawings.

A plane view of a photoelectric conversion device according to the second embodiment is the same as that shown in FIG. 1, explained in the fist embodiment. Further, a cross-sectional configuration taken along the line A-A' is also the same as that shown in FIG. 2.

The following elements are different from the first embodiment and explained in detail.

Figure 5:
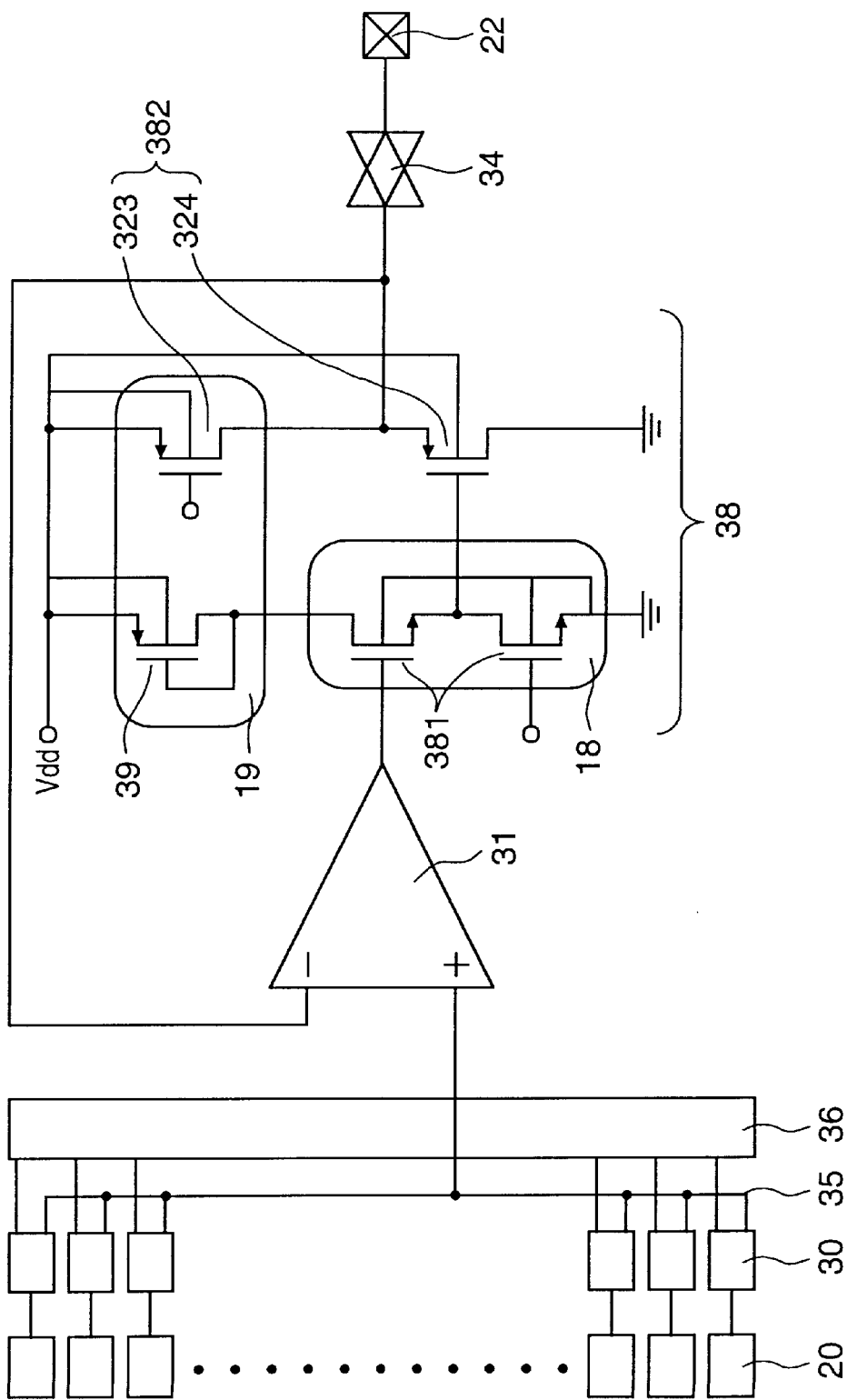
FIG. 5 shows a circuit configuration of a photoelectric conversion device according to the second embodiment of the present invention.

In the second embodiment, a configuration, shown in FIG. 5, of an output circuit 38 subsequent to the operational amplifier 31 differs from the first embodiment.

FIG. 5 is a view showing a circuit configuration of the photoelectric conversion device according to the second embodiment of the present invention. The photodetectors 20 are connected to the charge-voltage conversion units 30 where charges stored depending upon quantity of light incidented on the photodetectors 20 are converted to voltage signals. The voltage signals are sequentially outputted onto the common output line 35 in response to signals provided from the shift register 36 to the charge-voltage converters 30. The common output line 35 is connected to a positive terminal of the operational amplifier 31 and output of the output circuit 38 is connected to a negative terminal of the operational amplifier 31. After the voltage signals on the common output line 35 are processed by impedance conversion by the operational amplifier 31 and the output circuit 38, they are outputted outside via the switch 34 and the pad 22.

The output circuit 38 includes a source follower 381 configured with an nMOS transistor for level shifting and a constant current source, and a source follower 382 configured with a pMOS transistor for driving an external load. In order to suppress generation of stray carrier caused by impact ionization in the pMOS transistor of the source follower 381, a pMOS transistor 39 whose drain and gate are connected is provided as a voltage drop unit between the drain of the nMOS transistor of the source follower 381 and power source. The pMOS transistor 39 is used as the voltage drop unit in the first embodiment, however, the present invention is not limited to this, and a resistor or a diode may be used instead of the pMOS transistor.

Figure 6:
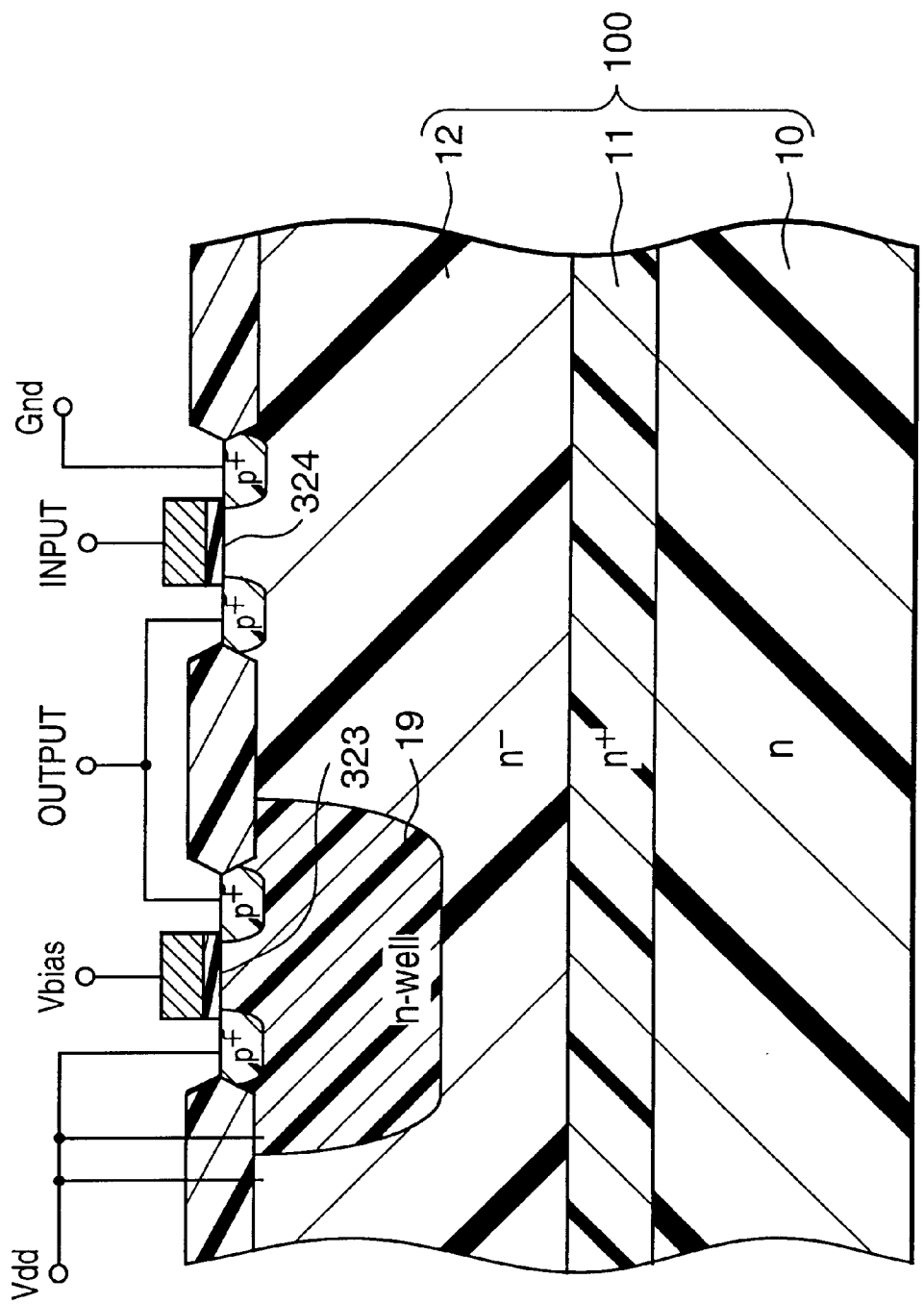
FIG. 6 is a cross sectional view of a pMOS source follower portion.

FIG. 6 is a conceptual view showing a crosssectional configuration of a portion where a pMOS source follower 382 is configured. Among two pMOS transistors forming the source follower 382, a pMOS transistor 323, connected to the power source side, is formed on an n type well 19 whose impurity concentration is higher than that of the n type semiconductor substrate on which the n type well 19 is formed. A pMOS transistor 324, connected to the ground side, is formed outside of the n type well 19 on the n type semiconductor substrate. An experimental result of the threshold voltage of the pMOS transistor 323 formed on the n type well 19 was about −0.75, and that of the threshold voltage of the pMOS transistor 324 formed outside of the n type well on the n type semiconductor substrate was about −0.29V.

In a case where the two pMOS transistors forming the pMOS follower circuit 382 were formed on the same well, the dynamic range of the output circuit was 1.98V to 4.46V, whereas, the dynamic range of the pMOS follower circuit 382 formed as above was 1.04V to 4.16V. Thus, the dynamic range is expanded by 0.64V with the configuration shown in FIG. 6.

In the second embodiment, the threshold voltages of the two pMOS transistors forming the source follower 382 were as written above, however, the threshold voltages are not limited to those values in the present invention.

According to the second embodiment as described above, it is possible to expand dynamic range of an output circuit by lowering the threshold voltage, which is a reference potential and increased by a back-gate effect, of a MOS transistor on the ground side.

Further, when forming MOS transistors of the same conduction type, but having different threshold voltages, it has been necessary to individually control impurity concentration of channels of the MOS transistors. However, by forming a MOS transistor on the power source side on a well whose impurity concentration is higher than a semiconductor substrate and forming a MOS transistor on the ground side outside of the well on the semiconductor substrate, it is possible to form the channels of the both transistors having different threshold voltages in the same manufacturing method.

Note, it is possible to apply the image sensing apparatus according to the second embodiment to an image sensor, similarly to the first embodiment.

Figure 10A:
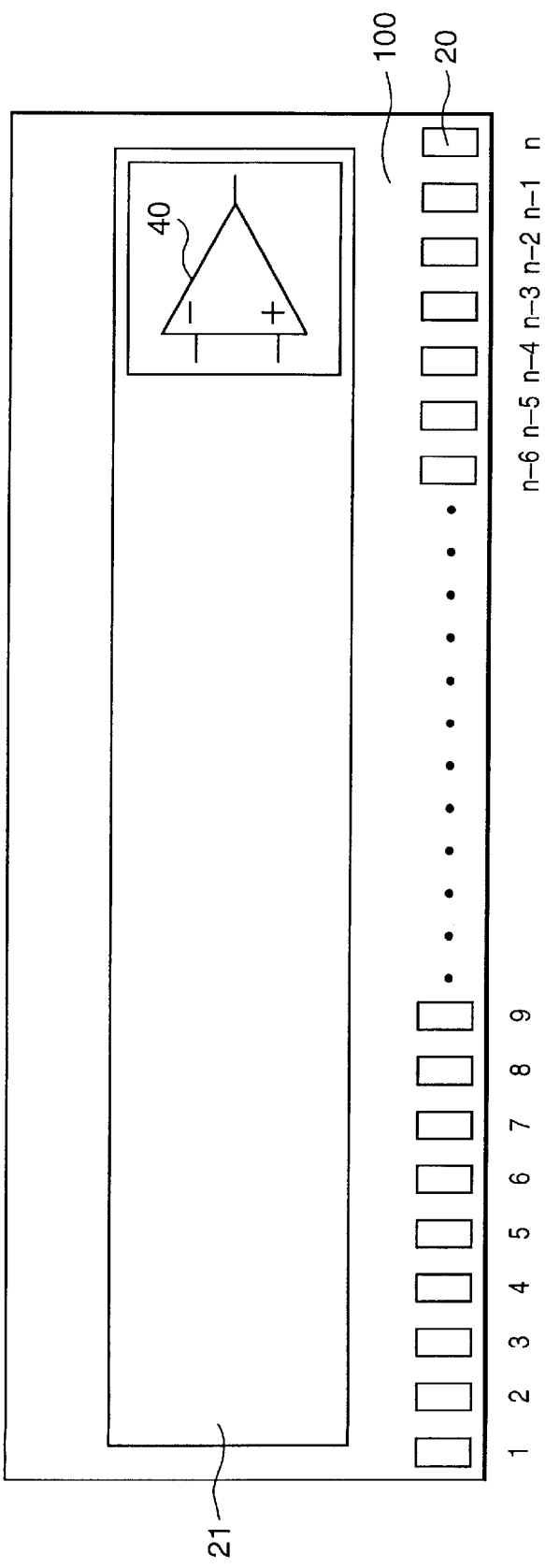
FIG. 10A briefly shows a configuration of the conventional one-dimensional image sensor.
Figure 10B:
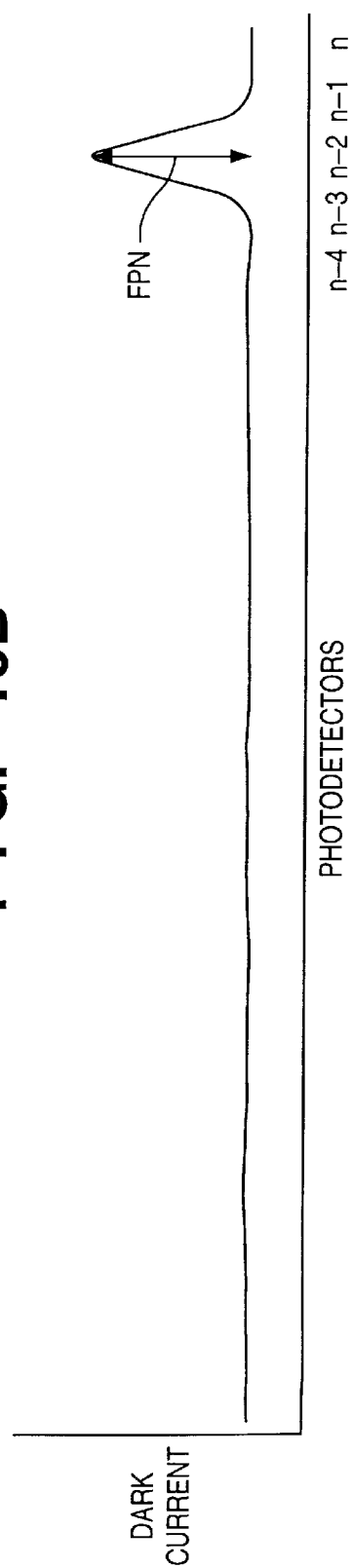
FIG. 10B is a graph showing generated fixed pattern noise caused by stray carrier in the conventional image sensor.

Further, in the first and second embodiment, a one-dimensional image sensor formed on a single semiconductor substrate is explained, however, it is possible to form a two-dimensional image sensor or image sensor. In both cases, by configuring them in the same manner as described above, it is possible to greatly reduce fixed pattern noise. As for the two dimensional image sensor, a horizontal shift register and vertical shift registers are provided, and image signals may be read by line from photodetectors formed as a matrix sequentially to obtain image signals representing a two-dimensional image. For instance, in a case where the fixed pattern noise as shown in FIG. 10 appears in two dimensions, by providing barrier areas around photodetectors, which are affected by stray carrier generated in the vicinity of peripheral circuits other than the photodetectors, on the semiconductor substrate, or by providing a voltage drop circuit, or by forming an output circuit with pMOS transistors for reducing generation of stray carrier, it is possible to greatly reduce the fixed pattern noise.

According to the first and second embodiments as described above, in the photoelectric conversion device having photodetectors and peripheral circuits which are integrally formed on a single semiconductor substrate, by configuring an output section, which has been a stray carrier source, for driving an external load outside of the photoelectric conversion device, with pMOS transistors without an nMOS transistor, it is possible to suppress the generation of stray carrier. Consequently, small stray carrier enters the photodetectors, thereby the fixed pattern noise is reduced.

Further, in a circuit, having photodetectors and peripheral circuits, whose output section for driving an external load is formed with a source follower configured with two pMOS transistors, by designing the source follower so that an absolute value of the threshold voltage of the pMOS transistor on the ground side is lower than that of the pMOS transistor in the power source side, it is possible to widen the dynamic range of the output section.

The present invention is not limited to the above embodiments and various changes and modifications can be made within the spirit and scope of the present invention. Therefore to apprise the public of the scope of the present invention, the following claims are made.

What is claimed is:

1. A photoelectric conversion apparatus on a single semiconductor substrate comprising:
   a plurality of photodetectors which are formed by providing a plurality of areas of second conduction type in an area of first conduction type, and which output electric signals in accordance with a quantity of incident light; and
   an output circuit, connected to a terminal for connecting to an external device, for outputting signals obtained by said plurality of photodetectors,
   wherein said output circuit includes a p-channel field effect transistor which receives the signals obtained by said plurality of photodetectors and outputs the signals to the terminal.

2. The photoelectric conversion device according to claim 1, wherein said output circuit includes a n-channel MOS transistor and, in said output circuit, a voltage drop means is provided between a drain of the n-channel MOS transistor and a power source.

3. The photoelectric conversion device according to claim 2, wherein said voltage drop means is configured using either a pMOS transistor, a resistor, or a diode.

4. The photoelectric conversion device according to claim 1, wherein the first conduction type is n conduction type, and the second conduction type is p conduction type.

5. The photoelectric conversion device according to claim 1, wherein said output circuit includes two p-channel MOS transistors and the two p-channel MOS transistors are connected in series between a power source and ground, an input signal is applied to a gate of the p-channel MOS transistors on the ground side and a signal is outputted from a connection point of the two p-channel MOS transistors, and an absolute value of a threshold voltage of the p-channel MOS transistor on the ground side is set lower than that of the p-channel MOS transistor on the power source side.

6. The photoelectric conversion device according to claim 5, wherein the p-channel MOS transistor on the power source side is formed on an n-type well whose impurity concentration is higher than that of an n-type semiconductor substrate, and the p-channel MOS transistor on the ground side is formed on the n-type semiconductor substrate outside of said n-type well.

7. The photoelectric conversion device according to claim 5, wherein said output circuit includes a n-channel MOS transistor and, in said output circuit, a voltage drop means is provided between a drain of the n-channel MOS transistor and the power source.

8. The photoelectric conversion device according to claim 7, wherein said voltage drop means is configured using either a pMOS transistor, a resistor, or a diode.

9. An image sensor having a plurality of photoelectric conversion devices formed on a single semiconductor substrate, wherein each photoelectric conversion device comprises:

a plurality of photodetectors which are formed by providing a plurality of areas of second conduction type in an area of first conduction type, and which output electric signals in accordance with a quantity of incident light; and an output circuit, connected to a terminal for connecting to an external device, for outputting signals obtained by said plurality of photodetectors, wherein said output circuit includes a p-channel field effect transistor which receives the signals obtained by said plurality of photodectectors and outputs the signals to the terminal.

10. The image sensor according to claim 9, wherein said output circuit includes two p-channel MOS transistors and the two p-channel MOS transistors are connected in series between a power source and ground, an input signal is applied to a gate of the p-channel MOS transistor on the ground side and a signal is outputted from a connection point of the two p-channel MOS transistors, and an absolute value of a threshold voltage of the p-channel MOS transistor on the ground side is set lower than that of the p-channel MOS transistor on the power source side.

11. The image sensor according to claim 10, wherein the p-channel MOS transistor on the power source side is formed on an n-type well whose impurity concentration is higher than that of an n-type semiconductor substrate, and the p-channel MOS transistor on the ground side is formed on the n-type semiconductor substrate outside of said n-type well.

12. The image sensor according to claim 9, wherein said output circuit includes a n-channel MOS transistor and in said output circuit, a voltage drop means is provided between a drain of the n-channel MOS transistor and the power source.

13. The image sensor according to claim 12, wherein said voltage drop means is configured using either a pMOS transistor, a resistor, or a diode.

14. The image sensor according to claim 9, wherein the first conduction type is n conduction type, and the second conduction type is p conduction type.

* * * * *

UNITED STATES PATENT AND TRADEMARK OFFICE
CERTIFICATE OF CORRECTION

PATENT NO.    : 6,184,516 B1
DATED         : February 6, 2001
INVENTOR(S)   : Sawada et al.

It is certified that error appears in the above-identified patent and that said Letters Patent is hereby corrected as shown below:

Column 4,
Line 25, delete "A-A'in" and please insert therefor -- A-A' in --

Column 6,
Line 23, delete "fist" and insert therefor -- first --
Line 24, delete "A-A'is" and insert therefor -- A-A' is --
Line 53, delete "pMOS" and insert therefor -- nMOS --
Line 61, delete "crosssectional" and insert therefor -- cross-sectional --

Signed and Sealed this

Seventh Day of May, 2002

*Attest:*

*Attesting Officer*

JAMES E. ROGAN
*Director of the United States Patent and Trademark Office*